(12) United States Patent
Kawashima et al.

(10) Patent No.: US 8,283,200 B2
(45) Date of Patent: Oct. 9, 2012

(54) MANUFACTURING METHOD OF THIN FILM TRANSISTOR AND THIN FILM TRANSISTOR, AND DISPLAY

(75) Inventors: Noriyuki Kawashima, Kanagawa (JP); Kazumasa Nomoto, Kanagawa (JP); Akihiro Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 322 days.

(21) Appl. No.: 11/746,738

(22) Filed: May 10, 2007

(65) Prior Publication Data

US 2008/0164463 A1    Jul. 10, 2008

(30) Foreign Application Priority Data

May 16, 2006    (JP) ................ P2006-135995

(51) Int. Cl.
*H01L 29/08* (2006.01)
(52) U.S. Cl. .......... 438/99; 438/623
(58) Field of Classification Search ........ 257/350, 257/642, 40, 59, E51.005, E51.006, E21.007, 257/E51.01, E23.167, E21.576; 438/99, 438/623
See application file for complete search history.

(56) References Cited

U.S. PATENT DOCUMENTS

| | | | |
|---|---|---|---|
| 7,718,549 B2 * | 5/2010 | Chua et al. | 438/780 |
| 2002/0057398 A1 * | 5/2002 | Ogawa | 349/61 |
| 2003/0059975 A1 * | 3/2003 | Sirringhaus et al. | 438/99 |
| 2003/0233065 A1 * | 12/2003 | Steward et al. | 604/22 |
| 2004/0263739 A1 * | 12/2004 | Sirringhaus et al. | 349/135 |
| 2005/0026421 A1 * | 2/2005 | Tanaka et al. | 438/622 |
| 2005/0057136 A1 * | 3/2005 | Moriya et al. | 313/311 |
| 2005/0104058 A1 * | 5/2005 | Veres et al. | 257/40 |
| 2005/0233065 A1 * | 10/2005 | Kisu et al. | 427/58 |
| 2008/0142788 A1 * | 6/2008 | Li et al. | 257/40 |

FOREIGN PATENT DOCUMENTS

JP     2005-277250     10/2005

OTHER PUBLICATIONS

Japanese Office Action issued on May 8, 2012, in connection with counterpart JP Application No. 2006-135995.

* cited by examiner

*Primary Examiner* — Kiesha Bryant
*Assistant Examiner* — Ali Naraghi
(74) *Attorney, Agent, or Firm* — SNR Denton US LLP (57) ABSTRACT

A manufacturing method of a thin film transistor made of a stack of an organic semiconductor layer, a gate insulating film and a gate electrode in this order on a substrate, which includes the steps of pattern coating a gate electrode material on the gate insulating film by printing; and carrying out a heat treatment to form the gate electrode resulting from drying for solidification of the pattern coated gate electrode material.

3 Claims, 6 Drawing Sheets

MANUFACTURING METHOD OF THIN FILM TRANSISTOR AND THIN FILM TRANSISTOR, AND DISPLAY

CROSS REFERENCES TO RELATED APPLICATIONS

The present invention contains subjects related to Japanese Patent Application JP 2006-135995 filed in the Japan Patent Office on May 16, 2006, the entire contents of which being incorporated herein by reference.

BACKGROUND OF THE INVENTION

1. Field of the Invention

The invention relates to a manufacturing method of a thin film transistor and to a thin film transistor and also to a display. In more detail, the invention relates to a manufacturing method of a thin film transistor of a top gate type using an organic semiconductor layer as a channel layer and to a thin film transistor and also to a display using the same.

2. Description of the Related Art

A thin film transistor (TFT) is widely used as a pixel transistor in electronic circuits, in particular flat panel displays of an active matrix type.

At present, the majority of thin film transistors is an Si based inorganic semiconductor transistor using amorphous silicon or polycrystalline silicon as a semiconductor layer. Since the manufacture of the same employs fabrication requiring a vacuum treatment chamber such as chemical vapor deposition (CVD) for the formation of a semiconductor layer, the process costs are high. Also, since a heat treatment at high temperatures is necessary, a substrate is required to have heat resistance.

On the other hand, in a thin film transistor utilizing an organic semiconductor, it is possible to coat and fabricate an organic semiconductor layer which becomes a channel layer at low temperatures. For that reason, not only such is advantageous for realizing low costs, but also it is possible to achieve the formation on a flexibly substrate with low heat resistance such as plastics.

Of the foregoing thin film transistors, in particular, a thin film transistor of a top gate type is studied as a drive device of an active matrix type in display devices such as electronic paper. In the case of the top gate structure, a channel layer is disposed in a side of a back side substrate with respect to a gate electrode as compared with the case of a bottom gate structure, and therefore, there is brought an advantage that influences of a potential of a pixel electrode against the channel layer can be made small. In the former case, as a forming method of the gate electrode, there is often employed an example in which a metal such as gold is subjected to pattern formation via a shadow mask by, for example, vapor deposition (see, for example, *Advanced Function Materials*, (United States) 2003, Vol. 13, p. 199; and *Applied Physics Letters*, (United States) 2002, Vol. 81, p. 1735 (Non-Patent Documents 1 and 2)).

SUMMARY OF THE INVENTION

However, in the vapor deposition via a shadow mask, it is difficult to form a fine pattern of not more than 100 μm in a large area, and there are involved problems that not only throughput of mass production becomes worse, but also the costs become high easily.

In view of the foregoing problems of the related art, it is desirable to provide a manufacturing method of a thin film transistor which is suitable for mass production and is able to be manufactured at low costs and a thin film transistor and also a display using the same.

According to an embodiment of the invention, there is provided a manufacturing method of a thin film transistor made of a stack of an organic semiconductor layer, a gate insulating film and a gate electrode in this order on a substrate, wherein the following steps are carried out successively. First of all, a step of pattern coating a gate electrode material on the gate insulating film by printing is carried out. Next, a heat treatment is carried out to form the gate electrode resulting from drying for solidification of the pattern coated gate electrode material.

Also, according to an embodiment of the invention, there is provided a thin film transistor made of a stack of an organic semiconductor layer, a gate insulating film and a gate electrode in this order on a substrate, wherein the gate electrode is formed by heat treating a gate electrode material having been pattern coated by printing.

According to the manufacturing method of a thin film transistor and the thin film transistor ad described above, since the gate electrode material is pattern coated by printing, the costs are low as compared with the case of pattern forming a gate electrode by employing a usual lithography technology, and they are suitable for mass production. Furthermore, as described later in detail in the section of "Detailed Description of the Preferred Embodiments", it has been confirmed that the thin film transistor having a gate electrode resulting from drying for solidification of the pattern coated gate electrode material is not only improved in a subthreshold characteristic but also increased in an on/off ratio as compared with a thin film transistor having a gate electrode formed by vapor deposition using a shadow mask, Also, according to an embodiment of the invention, there is provided a display including a thin film transistor made of a stack of an organic semiconductor layer, a gate insulating film and a gate electrode in this order on a substrate; and a display device connected to this thin film transistor disposed and formed on a substrate, wherein the gate electrode is formed by heat treating a gate electrode material having been pattern coated by printing.

According to such a display, by providing the foregoing thin film transistor, not only a subthreshold characteristic of the thin film transistor is improved, but also an on/off ratio is increased.

As described previously, since the manufacturing method of a thin film transistor and the thin film transistor according to embodiments of the invention are not only low in costs but also suitable for mass production, they are able to improve the productivity. Also, since not only a subthreshold characteristic of the thin film transistor is improved, but also an on/off ratio is increased, it is possible to obtain a thin film transistor having excellent electric characteristics.

Also, since the display according to an embodiment according to the invention is not only improved in a subthreshold characteristic but also increased in an on/off ratio, it is possible to design to realize low electricity consumption.

DETAILED DESCRIPTION OF THE PREFERRED EMBODIMENTS

Embodiments according to the invention are hereunder explained in detail with reference to the accompanying drawings.

<Manufacturing Method of Thin Film Transistor and Thin Film Transistor>

One example of a manufacturing method of a thin film transistor according to an embodiment of the invention is explained with reference to a sectional view of manufacturing step as illustrated in each of FIGS. 1A to 1D. The thin film transistor according to an embodiment of the invention is a thin film transistor of a top gate type (stagger type). In the present embodiment, a configuration of a thin film transistor of a top gate/bottom contact type is explained in order of manufacturing steps.

Figure 1A:
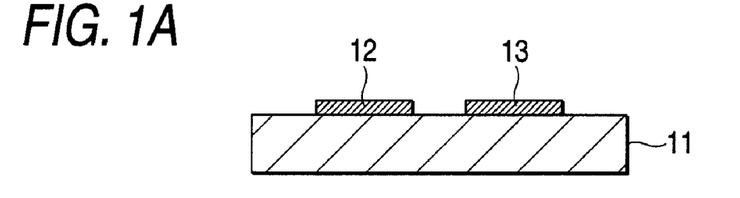
FIGS. 1A to 1D are each a sectional view of manufacturing step for explaining a manufacturing method of a thin film transistor according an embodiment of the invention.

First of all, as illustrated in FIG. 1A, a source electrode 12 and a drain electrode 13 are pattern formed on a substrate 11. In that case, a silver ink is coated on the plastic-made substrate 11 made of polyethersulfone (PES) by, for example, spin coating and heat treated at 150° C., thereby fabricating a conductive film (not illustrated) made of silver in a thickness of 30 nm. Next, a resist pattern in which patterns of the source electrode 12 and the drain electrode 13 are provided by photolithography is formed on the conductive film. Subsequently, the source electrode 12 and the drain electrode 13 are pattern formed by wet etching using a silver etching solution.

Though PES is used herein as the substrate 11, glass and plastics with high heat resistance such as polyethylene naphthalate (PEN), polyimide (PI), polycarbonate (PC), and polyacrylate (PAR) can also be used as the substrate 11.

Also, in addition to silver, metals having good ohmic contact with a p-type semiconductor (for example, gold, platinum, and palladium) and conductive organic materials made of poly(3,4-ethylenedioxythiophene)/poly(4-styrenesulfonate) [PEDOT/PSS] and polyaniline (PANI) can also be used as the source electrode 12 and the drain electrode 13.

Also, in the forming step of the source electrode 12 and the drain electrode 13, ink jetting, screen printing and laser plotting may be employed as a forming method of a resist pattern which is used for a mask of etching. Furthermore, direct patterning by ink jetting, screen printing or microcontact printing can also be employed. However, in a later step, an organic semiconductor layer is formed on the substrate 11 in a state that it covers the source electrode 12 and the drain electrode 13, and a gate insulating film is formed on the organic semiconductor layer. Accordingly, for the purpose of forming a good interface between the organic semiconductor layer and the gate insulating film, it is preferable that each of the source electrode 12 and the drain electrode 13 has a flat surface and has a thickness as not more than 100 nm as thin as possible. In order to form each of the flattened source electrode 12 and drain electrode 13 having a thickness of not more than 100 nm, it is preferred to employ the foregoing spin coating. Besides, gravure coating, roll coating, kiss coating, knife coating, die coating, slit coating, and blade coating can also be employed.

Figure 1B:
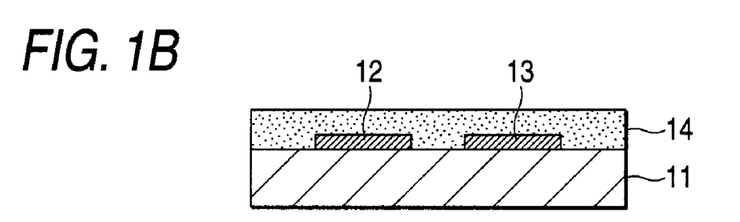

Next, as illustrated in FIG. 1B, an organic semiconductor layer 14 is formed on the substrate 11 in a state that it covers the source electrode 12 and the drain electrode 13. Here, a 1% by weight toluene solution of a pentacene derivative is coated by, for example, spin coating, and the solvent is then vaporized at 100° C., thereby forming the organic semiconductor layer 14 of 50 nm.

Here, in addition to the foregoing pentacene derivatives, high molecular weight materials (for example, polythiophene, fluorene-thiophene copolymers, and polyallylamine) and low molecular weight materials (for example, rubrene, thiophene oligomers, and naphthacene derivatives) may be used as the organic semiconductor 14.

Also, in addition to the foregoing spin coating, the organic semiconductor 14 may also be formed by printing such as ink jetting, dispenser method, flexography, gravure printing, and offset printing. Incidentally, though an example of forming the organic semiconductor layer 14 is formed in a solid film state is explained herein, the organic semiconductor layer 14 may be subjected to patterning for every device by various printing methods, or the organic semiconductor layer 14 may be subjected to pattern formation by vacuum deposition using a shadow mask.

Figure 1C:
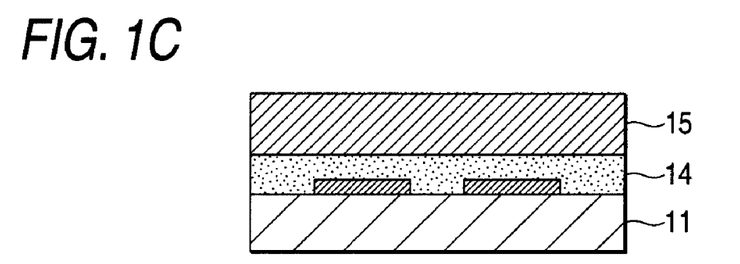

Next, as illustrated in FIG. 1C, a gate insulating film 15 is formed on the organic semiconductor layer 14. Here, it is preferable that a surface of the gate insulating film 15 coming into contact with the organic semiconductor layer 14 is constituted of a water-repellent material. Thus, when a gate electrode material is pattern coated on the gate insulating film 15 by printing and heat treated in a later step, the gate electrode material is dried for solidification, whereby an interfacial characteristic between the organic semiconductor layer 14 and the gate insulating film 15 is improved during the formation of a gate electrode. As the water-repellent material, fluorocarbon resins and resins containing a water-repellent surface treating agent containing a perfluoroalkyl group, an alkysilyl group or the like can be used. Here, an amorphous perfluorocarbon resin which is a fluorocarbon resin (for example, CYTOP 809M, manufactured by Asahi Glass Co., Ltd.) is coated on the organic semiconductor layer 14 by, for example, spin coating, and the solvent is vaporized at 100° C., thereby forming the gate insulating film 15 in a thickness of 4 μm. Thereafter, by subjecting a surface of the gate insulating film 15 made of a water-repellent material to oxygen ashing to modify the surface state, its adhesion to a gate electrode to be formed in an upper layer is improved.

Incidentally, though an example of configuring the gate insulating film 15 by a single-layer film made of a water-repellent material is explained herein, a stack film of two or more kinds of insulating films may be configured. For example, it is more preferable that a second insulating layer made of a crosslinking high molecular weight material such as polyvinylphenol (PVP) is stacked on a first insulating layer made of the foregoing water-repellent material to form the gate insulating film 15. In that case, a surface of the first insulating layer is subjected to oxygen ashing to form the second insulating layer. Thus, since the gate insulating film 15 becomes in a state that its gate electrode side as described later is covered by the crosslinking high molecular weight material, it is possible to prevent surely the leakage of a current. Examples of the foregoing crosslinking high molecular weight material which can be used include, in addition to the foregoing PVP, polymethyl methacrylate (PMMA), polyimide, polyvinyl alcohol (PVA), polyvinylidene fluoride (PVDF), polyisobutylene (PIB), polystyrene (PS), polyvinyl chloride (PVC), polyethylene terephthalate (PET), polycarbonate (PC), and benzocyclobutene (BCB).

Figure 1D:
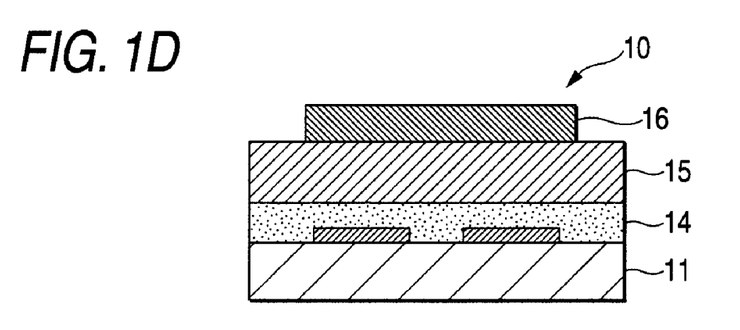

Next, as illustrated in FIG. 1D, a gate electrode 16 is formed on the gate insulating film 15. In that case, a gate electrode material made of a silver paste is pattern coated on the gate insulating film 15 by, for example, screen printing. Next, by performing a heat treatment, the foregoing silver paste is dried for solidification, thereby forming the gate electrode 16 made of silver. Here, it is preferable that the foregoing heat treatment is carried out at a temperature in the range of higher than a temperature at which a metal oxide contained in the gate electrode material is reduced and metallized and a temperature at which the foregoing organic semiconductor layer 14 is not deteriorated, for example, in a temperature range of 100° C. or higher and lower than 150° C. Here, the heat treatment is carried out at 120° C. Thus, not only the metal oxide contained in the silver paste is reduced and metallized, whereby the gate electrode 16 having a low resistivity value can be formed, but also the deterioration of the organic semiconductor layer 14 is prevented. Also, as described previously, after pattern coating the gate electrode material by printing, the heat treatment is carried out to form the gate electrode 16, whereby an interfacial characteristic between the organic semiconductor layer 14 and the gate insulating film 15 is improved.

Incidentally, though the gate electrode 16 is constituted of silver herein, in addition to silver, metals (for example, gold, platinum, and palladium) and conductive organic materials made of poly(3,4-ethylenedioxythiophene)/poly(4-styrenesulfonate) [PEDOT/PSS] and polyaniline (PANI) can also be used.

Also, though an example of pattern coating the gate electrode material by employing screen printing is explained herein, any printing method is employable in an embodiment according to the invention. For example, ink jetting, flexography, offset printing, and pad printing may be employed. However, the formation of a gate electrode by screen printing is preferable because even when the substrate has a large area, the gate electrode material can be pattern coated with good reproducibility.

A thin film transistor 10 of a top gate type is thus accomplished on the substrate 11.

Figure 2:
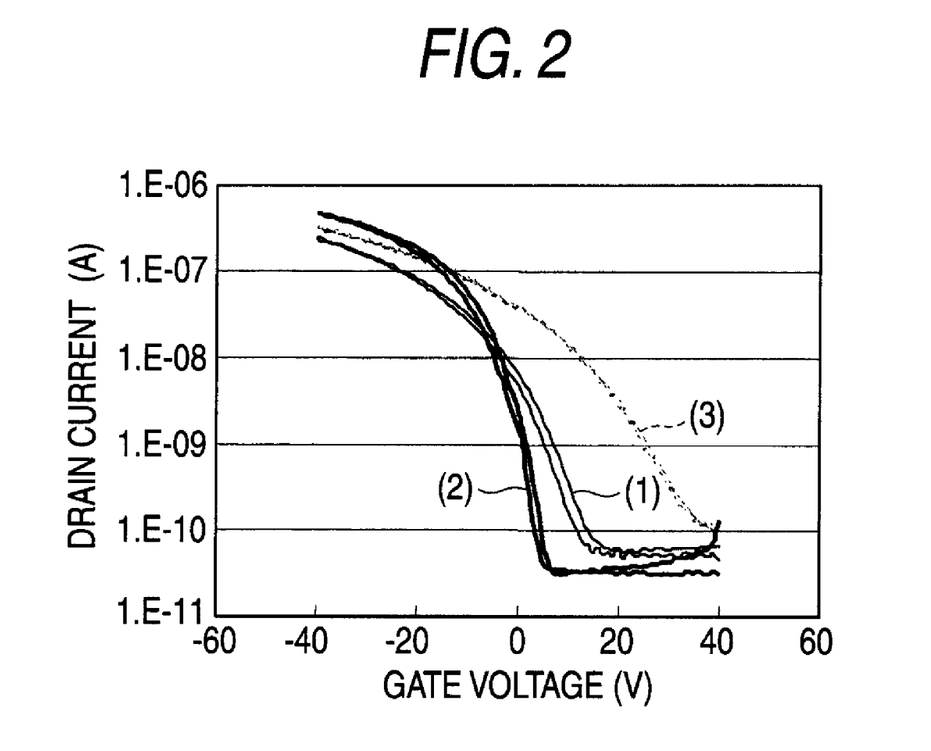
FIG. 2 is a graph to show a relationship between a gate voltage and a source current or a drain current in a thin film transistor.

Here, FIG. 2 shows results obtained by measuring gate voltage ($V_g$)–drain current ($I_d$) with respect to the thin film transistor 10 of the foregoing embodiment.

Here, a graph (1) shows results obtained by measuring the thin film transistor 10 in which the gate electrode 16 made of silver is formed on the gate insulating film 15 made of an amorphous perfluorocarbon resin by screen printing and heat treatment in the same manner as in the foregoing embodiment explained while referring to FIGS. 1A to 1D. Also, a graph (2) shows results obtained by measuring a thin film transistor in which the gate electrode 16 made of silver is formed on a gate insulating film in which a first insulating film made of an amorphous perfluorocarbon resin and a second insulating film made of PVP are stacked in this order by screen printing and heat treatment. Furthermore, a graph (3) shows results obtained by measuring a thin film transistor in which a gate electrode made of gold is formed on a gate insulating film made of an amorphous perfluorocarbon resin via a shadow mask by vapor deposition.

Incidentally, each of the thin film transistors is set up such that when a minus gate voltage (approximately −40 V) is applied, it becomes in an "ON" state. In measuring a drain current value, monitoring was carried out while continuously shifting the gate voltage in a minus direction and a plus direction.

As a result, it was confirmed that in the thin film transistor shown in the graph (3) to which an embodiment according to the invention is not applied, a turn-on voltage is 37 V, whereas in the thin film transistors shown in the graphs (1) and (2) to which an embodiment according to the invention is applied, a turn-on voltage is respectively 16 V and 6 V and shifted in a low voltage side, whereby a subthreshold characteristic is improved. Also, in the thin film transistors shown in the graphs (1) and (2), it was confirmed that an OFF-state current decreases and that an on/off ratio increases. In particular, in the case where the thin film transistor has a gate insulating film in which a first insulating film made of an amorphous perfluorocarbon resin and a second insulating film made of PVP are stacked as shown in the graph (2), it was confirmed that not only the subthreshold characteristic is markedly improved, but also the on/off ratio increases even in comparison with the results of the thin film transistor as shown in the graph (1).

Incidentally, while illustration is omitted herein, with respect to a thin film transistor of a bottom gate type in which a gate electrode is formed by screen printing and heat treatment, since irregularities are formed in a surface side of the gate electrode and irregularities are also formed on an interface between a gate insulating film and an organic semiconductor layer to be formed successively in an upper layer of the gate electrode, it was confirmed that a sufficient performance to such an extent that it is useful as a thin film transistor is not obtained.

<Display>

Next, a display to which the foregoing thin film transistor of the present embodiment is applied is explained while referring to a liquid crystal display of an active matrix type in which the foregoing thin film transistor is disposed and formed on a back side substrate as an example. Incidentally, in explaining the configuration of a display, configuring elements of the thin film transistor are given the same symbols as in FIGS. 1A to 1D and explained.

Figure 3:
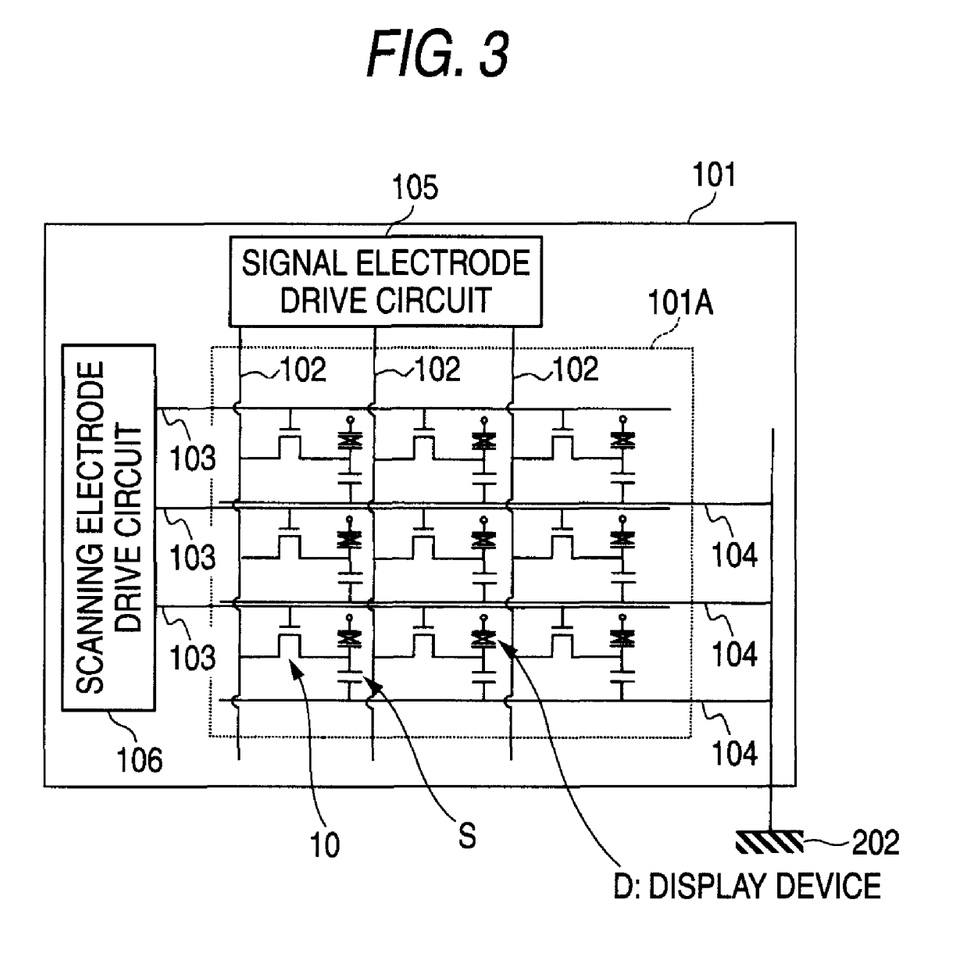
FIG. 3 is a circuit diagram provided on a back side substrate of a display according to an embodiment of the invention.

Here, a circuit diagram of an active matrix type provided on a back side substrate 101 in a display is illustrated in FIG. 3. As illustrated in this drawing, plural signal lines 102 and scanning lines 103 are disposed in a matrix state in a display region 101A positioned in a central part of the back side substrate 101 made of a plastic-made substrate. In each intersect between the scanning line 103 and the signal line 102, a thin film transistor 10 of a top gate type is provided as a pixel transistor. An auxiliary capacity device S and a display device D are connected to this thin film transistor 10, and an auxiliary capacity line 104 is disposed in parallel to the foregoing scanning line 103.

Also, a signal electrode drive circuit 105 to which the respective signal lines 102 are connected and a scanning electrode drive circuit 106 to which the respective scanning lines 103 are connected are disposed in a peripheral region of the display region 101A in the back side substrate 101. Also, the respective auxiliary capacity lines 104 are connected to a common electrode 202 disposed in a display side substrate as described later.

Figure 4A:
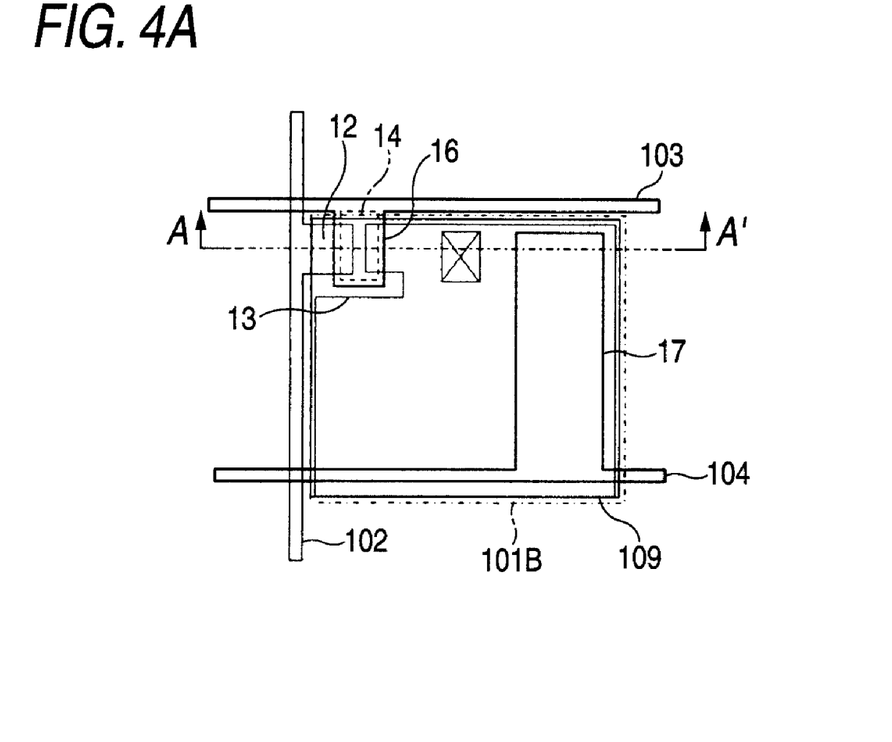
FIG. 4A is a plan view of a one-pixel portion for explaining a display according to an embodiment of the invention.
Figure 4B:
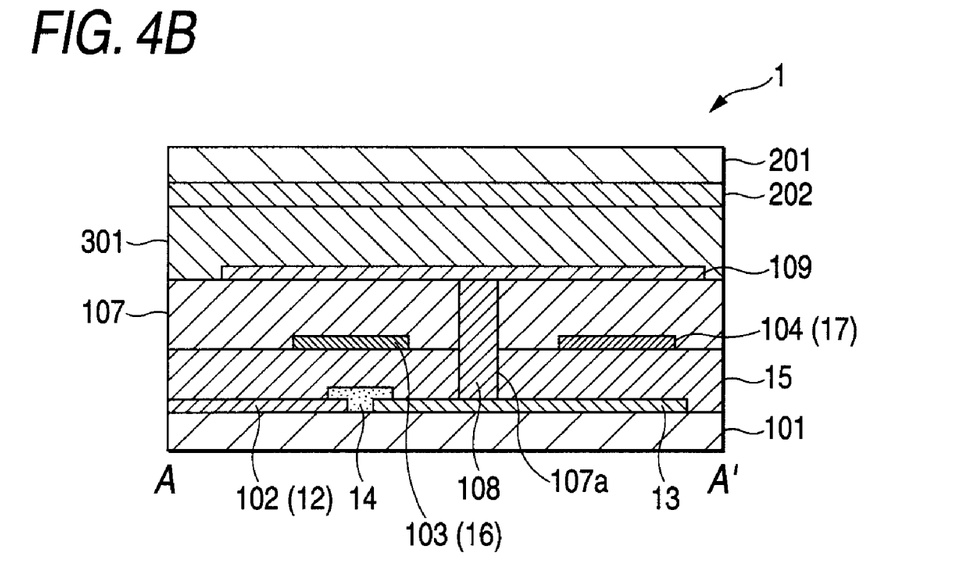
FIG. 4B is an A-A' line sectional view thereof.

Next, a more detail configuration of the display region 101A in the first substrate 101 is explained on the basis of a plan view of FIG. 4A and a sectional view of FIG. 4B. Here, FIG. 4A is an outline plan view in which a pixel region 101B surrounded by the signal line 102 and the scanning line 103 in the display region 101A (see FIG. 3) is enlarged; and FIG. 4B is an A-A' line sectional view in FIG. 4A.

The signal line 102 made of silver and the drain electrode 13 are pattern formed on the back side substrate 101 illustrated only in FIG. 4B. The signal 102 is disposed in a state that it is provided extending in one direction, and the source electrode 12 is configured of a part of the signal line 102. Also, the drain electrode 13 is disposed in a state that it covers the whole of the pixel region 101B within a range not coming into contact with the signal line 102. Incidentally, while an example in which the drain electrode 13 is disposed in a state that it covers the whole of the pixel region 101B has been explained herein, it is enough that the drain electrode 13 is provided in a state that it overlaps a via and an auxiliary capacity electrode as described later at minimum.

The organic semiconductor layer 14 made of, for example, a pentacene derivative, which becomes a channel layer is pattern formed on the back side substrate 101 between the source electrode 12 and the drain electrode 13. Also, the gate insulating film 15 made of an amorphous perfluorocarbon resin is provided on the back side substrate 101 including a top of the source electrode 12 and a top of the drain electrode 13 in a state that it covers this organic semiconductor layer 14.

The scanning line 103 made of silver is disposed on the foregoing gate insulating film 15 in a state that it is provided extending in a direction orthogonal to the foregoing signal line 102, and the auxiliary capacity line 104 made of silver is disposed in parallel to the foregoing scanning line 103. The gate electrode 16 configured of a part of the foregoing scanning line 103 is disposed in a state that it covers a top of the organic semiconductor layer 14; and an auxiliary capacity electrode 17 configured of a part of the auxiliary capacity line 104 is disposed in a state that it covers a part of a top of the foregoing drain electrode 13. By interposing the gate insulating film 15 between the drain electrode 13 and the auxiliary capacity electrode 17, the auxiliary capacity device S (see the foregoing FIG. 3) is configured. That is, the gate insulating film 15 also works as an auxiliary capacity insulating film.

Furthermore, an interlayer insulating film 107 is disposed on the gate insulating film 15 in a state that it covers the scanning line 103 and the auxiliary capacity line 104. Also, a via hole 107a reaching the foregoing drain electrode 13 is provided in the foregoing gate insulating film 15 and the foregoing interlayer insulating film 107. A pixel electrode 109 connected to the drain electrode 13 via a via 108 provided within the via hole 107a is disposed in a matrix state on the interlayer insulating film 107 in a state that it covers the whole of the pixel region 101B.

On the other hand, a display side substrate 201 which is disposed in a state that it is opposed to the foregoing back side substrate 101 is configured of a plastic-made substrate made of, for example, light transmissive PES. A common electrode 202 is disposed on a surface of the display side substrate 201 faced at a liquid crystal layer, and the auxiliary capacity line 104 disposed on the gate insulating film 15 is connected to this common electrode 202.

A liquid crystal layer 301 is interposed between the foregoing back side substrate 101 and the foregoing display side substrate 201 in a state that the pixel electrode 109 and the common electrode 202 are opposed to each other. For this liquid crystal layer 301, for example, a polymer dispersed liquid crystal (PDLC) is used.

Such a display is manufactured in the following manner. First of all, a conductive film made of silver is formed on the back side substrate 101 by, for example, spin coating, and the signal line 102 including the source electrode 12 and the drain electrode 13 are pattern formed by employing a usual lithography technology. Next, the organic semiconductor layer 14 made of a pentacene derivative is pattern formed by, for example, ink jetting. Next, the gate insulating film 15 made of an amorphous perfluorocarbon resin is formed on the back side substrate 101 including the top of the signal line 102 and the top of the drain electrode 13 by, for example, spin coating in a state that it covers the foregoing organic semiconductor layer 14.

Next, a gate electrode material made of a silver paste is pattern coated on the gate insulating film 15 by screen printing and heat treated at 120° C., thereby forming the scanning line 103 (gate electrode 16) made of silver and the auxiliary capacity line 104 (auxiliary capacity electrode 17). Subsequently, the interlayer insulating film 107 made of polyimide is formed on the gate insulating film 15 by, for example, die coating in a state that it covers the scanning line 103. Thereafter, the via hole 107a in a state that it reaches the drain electrode 13 is formed in a region between the gate electrode 16 and the auxiliary capacity electrode 17 in the interlayer insulating film 107 and the gate insulating film 15 by a usual lithography technology.

Next, a silver paste is screen printed in a state that it embeds this via hole 107a and dried for solidification, thereby not only forming the via 108 connected to the drain electrode 13 within the via hole 107a but also disposing the pixel electrode 109 connected to this via 108 on the interlayer insulating film 107 in a matrix state.

On the other hand, the common electrode 202 made of ITO (indium tin oxide) is formed on the display side substrate 201 by, for example, sputtering.

Next, the back side substrate 101 and the display side substrate 201 are disposed opposite to each other in a state that the foregoing pixel electrode 109 and the foregoing common electrode 202 are opposed to each other, thereby bonding the both with a sealing material (not illustrated) provided in the surroundings of the back side substrate 101 and the display side substrate 201. Subsequently, a liquid crystal material is filled between the back side substrate 101 and the display side substrate 201, thereby forming the liquid crystal layer 301. The liquid crystal display 1 thus accomplished is configured such that the display device D (see the foregoing FIG. 3) in which the liquid crystal layer 301 is interposed between the pixel electrode 109 and the common electrode 202 is disposed and formed in the thin film transistor 10 of a top gate type.

In the light of the above, according to the manufacturing method of a thin film transistor and the thin film transistor of the present embodiment, since the gate electrode material is pattern coated by printing, this case is low in costs and suitable for mass production as compared with the case of pattern forming the gate electrode 16 by employing a usual lithography technology. Accordingly, it is possible to improve the productivity. Furthermore, in the case of the thin film transistor 10 having the gate electrode 16 resulting from drying for solidification of the pattern coated gate electrode material, as explained previously while referring to FIG. 2, not only a subthreshold characteristic is improved, but also an on/off ratio increases as compared with the case of a thin film transistor having a gate electrode formed by vapor deposition using a shadow mask. Thus, it is possible to obtain a thin film transistor having excellent electric characteristics.

Also, since the display according to the present embodiment is not only improved in a subthreshold characteristic of the thin film transistor 10 but also increased in an on/off ratio, it is possible to design to realize low electricity consumption. Furthermore, according to the display of the present embodiment, when the pixel electrode 109 in a state that it is connected to the drain electrode 13 is formed on the interlayer insulating film 107 in a state that it covers the pixel region 101B, an aperture can be taken widely so that it is possible to improve a luminance.

Modification Example 1

Incidentally, in the foregoing embodiment, though an example of forming the scanning line 103 and the auxiliary capacity line 104 in the same layer has been explained, the scanning line 103 and the auxiliary capacity line 104 may be formed in a different layer from each other. In that case, an outline configuration of the drive circuit to be provided in the back side substrate 101 is the same as that explained while referring to FIG. 3 in the embodiment. In the present Modification Example, the same configurations as those in the foregoing embodiment are given the same symbols and explained.

Figure 5A:
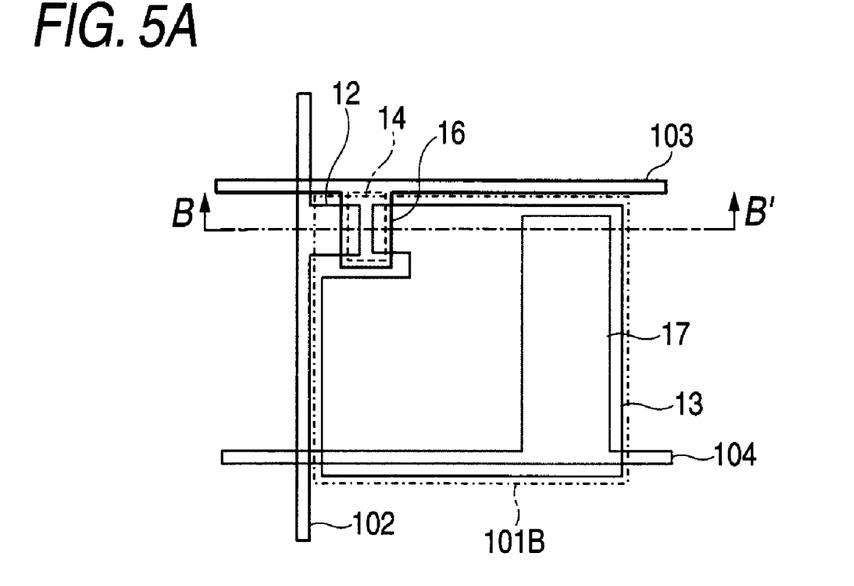
FIG. 5A is a plain view of a one-pixel portion for explaining Modification Example 1 of a display according to an embodiment of the invention.
Figure 5B:
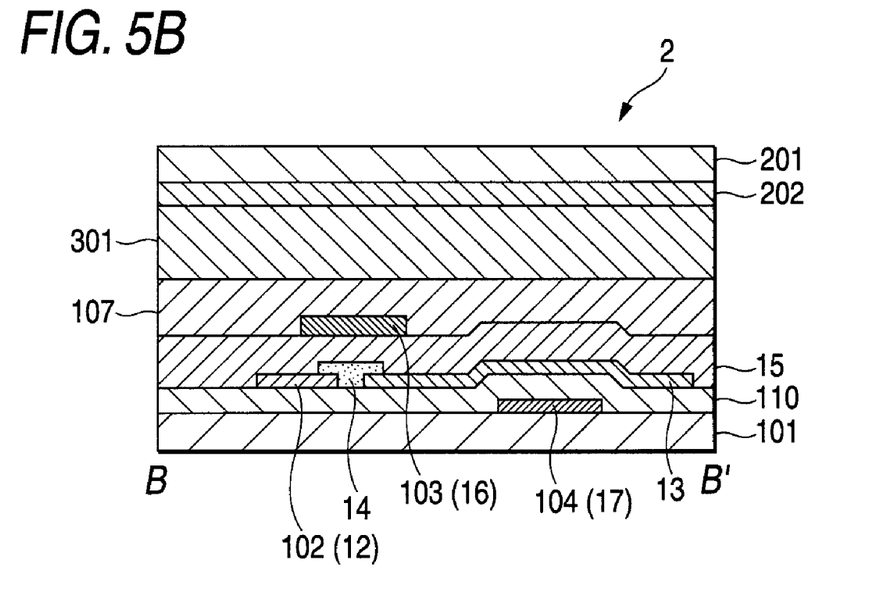
FIG. 5B is a B-B' line sectional view thereof.

Here, FIG. 5A is an outline plan view in which a pixel region 101B surrounded by a signal line 102 and a scanning line 103 in the display region 101A (see FIG. 3) is enlarged; and FIG. 5B is a B-B' line sectional view in FIG. 5A.

Here, an auxiliary capacity line 104 made of, for example, silver, apart of which becomes an auxiliary capacity electrode 17, is pattern formed on a back side substrate 101 illustrated only in FIG. 5B in a state that it is provided extending in one direction. This auxiliary capacity line 104 is disposed in parallel to a scanning line as described later. Incidentally, though an example in which the auxiliary capacity line 104 is disposed in parallel to the scanning line is explained herein, the disposal shape of the auxiliary capacity line 104 is not particularly limited and, for example, the auxiliary capacity line 104 may be disposed in parallel to a signal line as described later.

Incidentally, though the auxiliary capacity line 104 is constituted of silver herein, metals (for example, gold, platinum, and palladium) and conductive organic materials made of poly(3,4-ethylenedioxythiophene)/poly(4-styrenesulfonate) [PEDOT/PSS] and polyaniline (PANI) can also be used.

Also, an auxiliary capacity insulating film 110 is disposed on the back side substrate 101 in a state that it covers the foregoing auxiliary capacity line 104. Here, it is preferable that this auxiliary capacity insulating film 110 is made of a material having a relatively large dielectric constant as from approximately 4 to 20 and formed in a thickness thinner than that of a gate insulating film as described later. For example, PVP can be used as this auxiliary capacity insulating film 110. Thus, as described in detail later, it is possible to design an auxiliary capacity ($C_s$) large against a gate electrode-to-source electrode capacity ($C_{gs}$).

Also, the signal line 102 a part of which becomes a source electrode 12 and a drain electrode 13 are pattern formed on the auxiliary capacity insulating film 110. This signal line 102 is provided extending in an orthogonal state to the foregoing auxiliary capacity line 104, and the drain electrode 13 is disposed in a state that it covers the entire region of the pixel region 101B within a range of not coming into contact with the signal line 102. Here, a pixel electrode of a display device is configured in a state that it is connected to this drain electrode 13 in the same layer. For that reason, in the display of the present embodiment, a via for the extraction from the drain electrode 13 into the pixel electrode may not be formed, thereby omitting the formation step of a via. Such is preferable because not only a complicated lithography step for forming a via hole may not be carried out, but also a via hole may not be formed in a gate insulating film or an interlayer insulating film formed by coating in which an etching selection ratio to a resist material is hardly taken. By interposing the auxiliary capacity insulating film 110 between the drain electrode 13 and the auxiliary capacity electrode 17, an auxiliary capacity device S (see the foregoing FIG. 3) is configured.

Also, an organic semiconductor layer 14 made of, for example, a pentacene derivative, which becomes a channel layer is pattern formed on the auxiliary capacity insulating film 110 between the source electrode 12 and the drain electrode 13. Also, a gate insulating film 15 is provided on the auxiliary capacity insulating film 110 including a top of the source electrode 12 and a top of the drain electrode 13 in a state that it covers this organic semiconductor layer 14.

The scanning line 103 is disposed on the foregoing gate insulating film 15 in a state that it is provided extending in a direction orthogonal to the foregoing signal line 102 and in parallel to the foregoing auxiliary capacity line 104. Also, a gate electrode 16 configured of a part of the foregoing scanning line 103 is disposed in a state that it covers a top of the organic semiconductor layer 14. Furthermore, an interlayer insulating film 107 is disposed on the gate insulating film 15 in a state that it covers this scanning line 103.

On the other hand, likewise the embodiment, in the display side substrate 201 to be disposed in a state that it is opposed to the foregoing back side substrate 101, a common electrode 202 is fabricated, and a liquid crystal layer 301 is interposed between the back side substrate 101 and a display side substrate 201 in a state that their electrode forming surface sides are opposed to each other.

Such a display is manufactured in the following manner. First of all, a silver ink is coated on the back side substrate 101 by, for example, spin coating and heat treated at 150° C., thereby fabricating a conductive film (not illustrated) made of silver in a thickness of 30 nm. Next, the auxiliary capacity line 104 made of silver is pattern formed by employing a usual lithography technology.

Here, in the forming step of the foregoing auxiliary capacity line 104, ink jetting, screen printing and laser plotting may be employed as a forming method of a resist pattern used for a mask of etching. Furthermore, direct patterning by ink jetting, screen printing or microcontact printing can also be employed. However, in a later step, since an auxiliary capacity insulating film and a drain electrode (pixel electrode) are stacked successively on the back side substrate 101 in a state that it covers the auxiliary capacity line 104, for the purpose of realizing good maintenance of a charge with less leakage of a current in an auxiliary capacity part, it is preferable that the surface of the auxiliary capacity line 104 has a flat surface and has a thickness as not more than 100 nm as thin as possible. In order to form the auxiliary capacity line 104 having a flattened surface and having a thickness of not more than 100 nm, it is preferred to employ the foregoing spin coating because the reproducibility is high. Besides, gravure coating, roll coating, kiss coating, knife coating, die coating, slit coating, and blade coating can also be employed.

Next, the auxiliary capacity insulating film 110 made of PVP is formed on the back side substrate 101 by, for example, die coating in a state that it covers the auxiliary capacity line 104. Next, a conductive film made of silver is formed on the auxiliary capacity insulating film 110 by, for example, spin coating, and the signal line 102 including the source electrode 12 and the drain electrode 13 are pattern formed by employing a usual lithography technology.

Next, the organic semiconductor layer 14 made of a pentacene derivative is pattern formed on the auxiliary capacity insulating film 110 between the source electrode 12 and the drain electrode 13 by, for example, ink jetting. Next, the gate insulating film 15 is formed on the auxiliary capacity insulating film 110 including a top of the signal line 102 and a top of the drain electrode 13 by, for example, spin coating in a state that it covers the foregoing organic semiconductor layer 14.

Next, a gate electrode material made of a silver paste is pattern coated on the gate insulating film 15 by screen printing and heat treated at 120° C., thereby forming the scanning line 103 (gate electrode 16) made of silver. Subsequently, the interlayer insulating film 107 made of polyimide is formed on the gate insulating film 15 by, for example, die coating in a state that it covers the scanning line 103.

The subsequent steps are carried out in the same manner as in the embodiment. That is, the common electrode 202 is formed on the display side substrate 201; and the back side substrate 101 and the display side substrate 201 are disposed opposite to each other in a state that their electrode forming surfaces are opposed to each other, thereby bonding the both with a sealing material (not illustrated) provided in the surroundings of the back side substrate 101 and the display side substrate 201. Subsequently, a liquid crystal material is filled between the back side substrate 101 and the display side substrate 201, thereby forming the liquid crystal layer 301.

The liquid crystal display 2 thus accomplished is configured such that a display device D (see the foregoing FIG. 3) in which the liquid crystal layer 301 is interposed between the pixel electrode made of the drain electrode 13 and the common electrode 202 is disposed and formed in the thin film transistor 10 of a top gate type.

Figure 6:
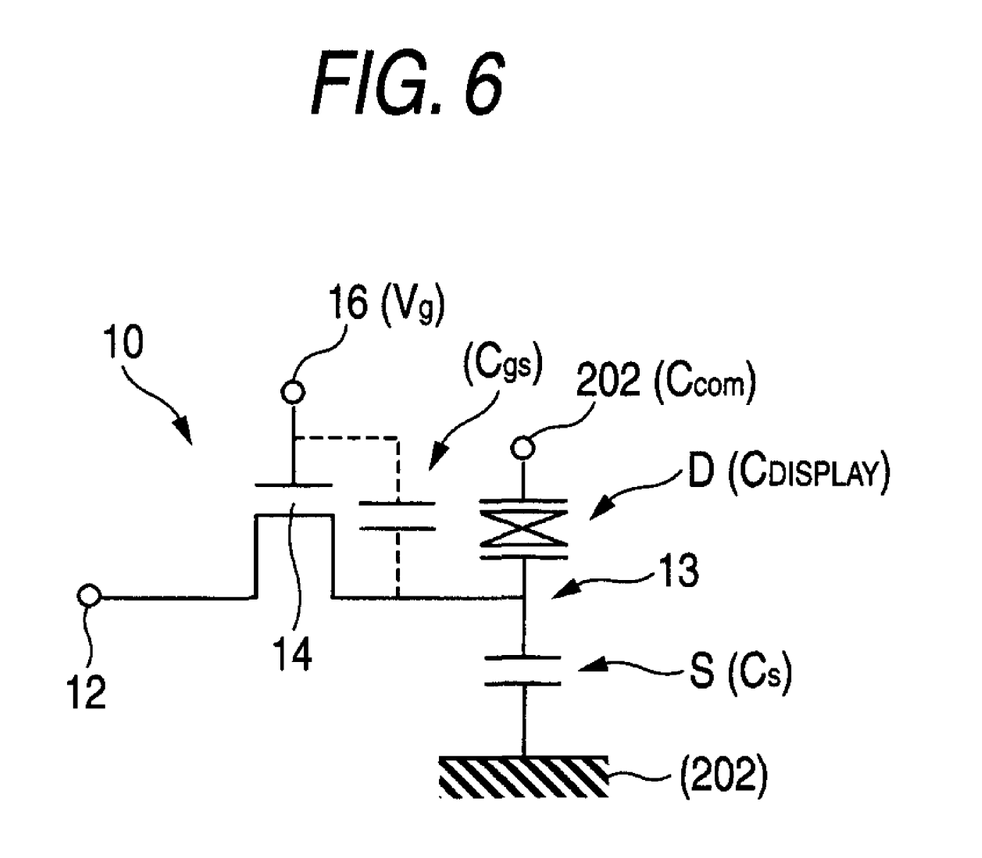
FIG. 6 is an equivalent circuit diagram of a display device in Modification Example 1 of a display according to an embodiment of the invention.

Here, a pixel equivalent circuit diagram of the foregoing display device D is illustrated in FIG. 6. As illustrated in this drawing, the display device D and the auxiliary capacity device S are connected to the thin film transistor 10 in which the source electrode 12, the drain electrode 13, the organic semiconductor layer 14 and the gate electrode 16 are stacked in this order.

In this equivalent circuit diagram, when the pixel electrode charged at the time when the thin film transistor 10 is in an ON-state [(gate voltage $V_g$)=$V_{HIGH}$] becomes in an OFF-state [(gate voltage $V_g$)=$V_{LOW}$], it is influenced by the transition of the gate voltage, whereby the potential is lowered. The lowering of this voltage is called a field through voltage ($\Delta V$) and expressed by the following expression (1).

$$\Delta V = \frac{C_{gs}}{C_{display} + C_s + C_{gs}}(V_{HIGH} - V_{LOW}) \quad (1)$$

$C_{gs}$: gate electrode-to-source electrode capacity
$C_{display}$: capacity of display part
$C_s$: auxiliary capacity Though a shift of this field through voltage ($\Delta V$) can be corrected by adjusting a $V_{com}$ voltage of the common electrode 202, it is desirable that it is designed to be as small as possible. Namely, in order to make $\Delta V$ small, the design must be made such that the gate electrode-to-source electrode capacity ($C_{gs}$) is small, whereas the auxiliary capacity ($C_s$) is large. The capacity C is regulated by dielectric constant and thickness of the insulating film as expressed by the following expression (2).

$$C = \frac{\varepsilon_0 \varepsilon_r}{t} \quad (2)$$

$\varepsilon_0$: dielectric constant in vacuo
$\varepsilon_r$: dielectric constant of insulating film
t: thickness of insulating film In the embodiment, as explained previously while referring to FIGS. 4A and 4B, in the case where the scanning line 103 and the auxiliary capacity line 104 are formed in the same layer, since the gate insulating film 15 also works as an auxiliary capacity insulating film, a ratio of the gate electrode-to-source electrode capacity ($C_{gs}$) and the auxiliary capacity ($C_s$) is regulated by an area ratio of the gate electrode 16 and the auxiliary capacity electrode 17.

However, as in the present Modification Example, in the case where the scanning line 103 and the auxiliary capacity line 104 are formed in a different layer from each other, since a ratio of the auxiliary capacity ($C_s$) to the gate electrode-to-source electrode capacity ($C_{gs}$) can be made large by not only using a material having a high dielectric constant for the auxiliary capacity insulating film 110 but also forming the auxiliary capacity insulating film 110 in a thickness thinner than that of the gate insulating film 15, the field through voltage ($\Delta V$) is reduced.

As explained previously, according to the liquid crystal display 2 of the present Modification Example, since the scanning line 103 is formed by heat treating the gate electrode material having been pattern formed by printing, the same effects as in the foregoing embodiment can be brought.

Furthermore, according to the display of the present Modification Example, since the auxiliary capacity line 104 and the scanning line 103 are formed in a different layer from each other, the field through voltage ($\Delta V$) can be made small as described previously. Also, according to the foregoing display, since the drain electrode 13 also works as a pixel electrode, the forming step of a via can be omitted, and therefore, the manufacturing steps are simplified.

Incidentally, though in the foregoing embodiment and Modification Example 1, an example of a thin film transistor of a top gate/bottom contact type has been explained, an embodiment according to the invention is also applicable to a thin film transistor of a top gate/top contact type. Also, though in the foregoing embodiment and Modification Example 1, an example of a display provided with a liquid crystal display device as the display device D has been explained, it should not be construed that an embodiment according to the invention is limited thereto, but other display devices, for example, an organic electroluminescent device (organic EL device) and an electrophoresis type display device (E-ink) may be provided.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a thin film transistor comprising an organic semiconductor layer, a gate insulating film and a gate electrode stacked in that order on a substrate, the method comprising:
    forming a gate insulating film on the organic semiconductor layer, the gate insulating film being a single layer of a water-repellant material;
    thereafter subjecting a surface of the gate insulating film to oxygen ashing;
    pattern coating, using a printing process, a gate electrode material on the surface of the gate insulating film that has been subjected to the oxygen ashing; and
    heat treating the gate electrode material at a temperature from 100° C. to 150° C. to form the gate electrode.

2. The method of manufacturing a thin film transistor according to claim 1, wherein the printing process is a screen printing process.

3. The method of manufacturing a thin film transistor according to claim 1, further comprising:

forming a source electrode or a drain electrode on the substrate or the organic semiconductor layer prior to forming the gate insulating film.

* * * * *